United States Patent
Thakur et al.

Patent Number: 6,090,723
Date of Patent: *Jul. 18, 2000

[54] CONDITIONING OF DIELECTRIC MATERIALS

[75] Inventors: Randhir P. S. Thakur; Scott J. Deboer, both of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/797,900

[22] Filed: Feb. 10, 1997

[51] Int. Cl.$^7$ .................................................. H01L 21/31

[52] U.S. Cl. ............................................. 438/778; 438/784

[58] Field of Search .................................. 427/126.3, 573; 438/396, 471, 476, 487, 778, 792, 665, 964, 784; 257/314, 347, 649

[56] References Cited

U.S. PATENT DOCUMENTS

| | | | |
|---|---|---|---|
| 5,264,724 | 11/1993 | Brown et al. | 257/347 |
| 5,527,567 | 6/1996 | Desu et al. | 427/573 |
| 5,529,937 | 6/1996 | Zhang et al. | 438/471 |
| 5,759,262 | 6/1998 | Weimer et al. | 117/88 |

FOREIGN PATENT DOCUMENTS

| | | |
|---|---|---|
| 4-93067 | 3/1992 | Japan . |
| 4-171975 | 6/1992 | Japan . |
| 6-333814 | 12/1994 | Japan . |

OTHER PUBLICATIONS

"How Rapid Isothermal Processing Can Be a Cominant Semiconductor Processing Technology in the 21$^{st}$ Century" Mat. Res. Soc. Symp. Proc. vol. 429, 1996 Materials Research Society, pp. 81–94.

"Development Trends in Rapid Isothermal Processing (RIP) Dominated Semiconductor Manufacturing"—R. Singh, Department of Electrical and Computer Engineering Clemson University, pp. 31–42.

"Metalorganic Chemical Apor Deposition (MOCVD) of Oxides for Electronic and Photonic Applications"—The Minerals, Metals & Materials Society, 1995, pp. 211–220.

"UV–$O_3$ and Dry–$O_2$: Two–Step Annealed Chemical Vapor–Deposited $Ta_2O_5$ Films for Storage Dielectrics of 64–Mb DRAM's"—IEEE Transactions on Electron Devices, vol. 38, No. 3, Mar. 1991, pp. 455–462.

*Primary Examiner*—David Nelms
*Assistant Examiner*—Renee' R. Berry

[57] ABSTRACT

A method for conditioning a dielectric material on a semiconductor substrate structure during a semiconductor fabrication process, comprising the steps of: irradiating the dielectric material using ultraviolet light irradiation while in a ambient exhibiting the properties of self-limiting oxidation, during a first annealing period; following the first annealing period by exposing the dielectric material to an oxygen ambient during a second annealing period. This method may be applied to the conditioning of a capacitor dielectric on a capacitor structure, or to the conditioning of a field effect transistor gate dielectric on a field effect transistor gate structure or to the conditioning of insulative spacers about the sidewalls of a field effect transistor gate structure.

15 Claims, 4 Drawing Sheets

CONDITIONING OF DIELECTRIC MATERIALS

FIELD OF THE INVENTION

This invention relates to semiconductor technology and more specifically to methods of forming conditioned dielectric materials for use in semiconductor devices and in particular for use in dynamic random access memory (DRAM) semiconductor devices.

BACKGROUND OF THE INVENTION

Photochemistry has become an important area to consider in the semiconductor fabrication process. As an example, for the deposition of high temperature superconducting thin films, rapid isothermal processing (RIP) assisted metalorganic chemical vapor deposition (MOCVD) has provided the best low processing temperature results. This is due to the fact that incoherent radiation is the source of optical and thermal energy. Although the decomposition pathways of most of the reactions are not accurately known, in general, most of the organometallics used in MOCVD have higher adsorption coefficients in ultraviolet (UV) and vacuum ultraviolet (VUV) regions. High energy photons, from the UV and VUV regions, provide excited but not dissociated complexes. Thus, in concert with the low energy photons (responsible for the thermal or pyrolysis deposition), the high energy photons can provide the ideal MOCVD approach for the growth of many materials.

A photochemical reaction is a chemical reaction which takes place only under the influence of light. For the purposes of photochemistry, light is considered as being made up of individual photons of energy E=hv, where h is Planck's constant and v is the frequency of light. Only light that is absorbed can result in a photochemical effect. On the molecular scale the photochemical reaction starts with the adsorption of a photon by a molecule. The molecule is thereby promoted to an excited state. This excited molecule is a new chemical species which has its own distinct chemical and physical properties.

Any photochemical event starts with the absorption of a photon by a molecule M, with production of an excited molecule M*, where M+hv=M* (adsorption). The excited molecule M* may now react chemically, either by rearrangement or, for instance, by reaction with another species N: M*+N=P. This step, which chemically involves chemically the excited molecule M*, is the primary photochemical process.

Another type of molecule excitation is rotational excitation, which requires the smallest amount of energy. Rotational excitation results in a spinning of the molecule around a preferred axis, while the molecule is chemically unchanged. With higher energies, the molecule can be promoted to a vibrationally excited state. Here again the molecule is chemically unchanged as the energy is in the form of vibrations of various parts of the molecule. With even higher energies, the molecule will be electronically excited as one or several electrons are promoted to higher energy orbitals. Photochemical reactions occur from such electronically excited state of molecules The ground state of the atom is the state in which all the electrons fill the available orbitals in the order of increasing energy. An electronically excited state is a state in which one or several electrons occupy higher energy orbitals, having left one or several vacancies in the lower orbitals. A ground state can only adsorb light, it cannot emit light. An excited state can either emit light (thus moving downwards in energy to the ground state or to a lower excited state) or absorb light (thus moving upwards in energy to a higher excited state).

In an article entitled "METALORGANIC CHEMICAL VAPOR DEPOSITION (MOCVD) OF OXIDES FOR ELECTRONIC AND PHOTONIC APPLICATIONS" by Singh et al., the authors teach how a VUV lamp greatly improves the quality of $Y_2O_3$ films due to the use of higher energy photons in the deposition process. Singh et al. state: "Lamp configuration plays an important role in film deposition, which is very useful in the optimization of lamp heating source design. The leakage current density of $Y_2O_3$ is good enough to replace $SiO_2$ as the insulator in the devices processing. Good films can be grown at low substrate temperature by using VUV lamps as the source of optical energy."

While Singh et al. teach that a dielectric film's quality is greatly improved by the use of higher energy photons during deposition, the present invention develops a methodology to condition any dielectric film, no matter how it is deposited, by the use of higher energy photons so that the quality of the conditioned dielectric is greatly improved.

SUMMARY OF THE INVENTION

An exemplary implementation of the present invention discloses a method for conditioning a dielectric material on a semiconductor substrate structure during a semiconductor fabrication process, comprising the steps of: irradiating the dielectric material using ultraviolet light irradiation while in a ambient that exhibits the properties of self-limiting oxidation, during a first annealing period; and following the first annealing period by exposing the dielectric material to an oxygen ambient during a second annealing period. This method, for example, may be applied to the conditioning of a capacitor dielectric on a capacitor structure, or to the conditioning of a field effect transistor gate dielectric on a field effect transistor gate structure or to the conditioning of insulative spacers about the sidewalls of a field effect transistor gate structure.

DETAILED DESCRIPTION OF THE INVENTION

Exemplary implementations of the present invention are depicted in FIGS. 1 through 7. These exemplary embodiments will be appreciated by one skilled in the art, as taught from the following descriptions of the invention.

In an exemplary embodiment of the present invention, a method for conditioning a dielectric material at various stages of a semiconductor fabrication process to fabricate dynamic random access memory cell, is depicted in FIGS. 1–7.

Figure 1:
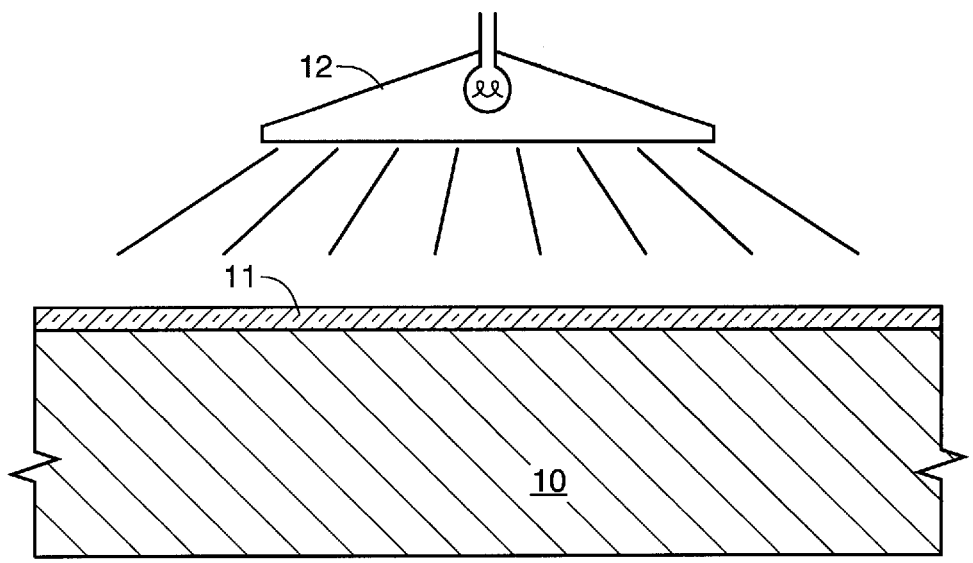
FIG. 1 shows an in-process semiconductor wafer assembly as depicted in a cross-sectional view of a DRAM array, wherein the wafer assembly is being subjected to UV light.
Figure 2:
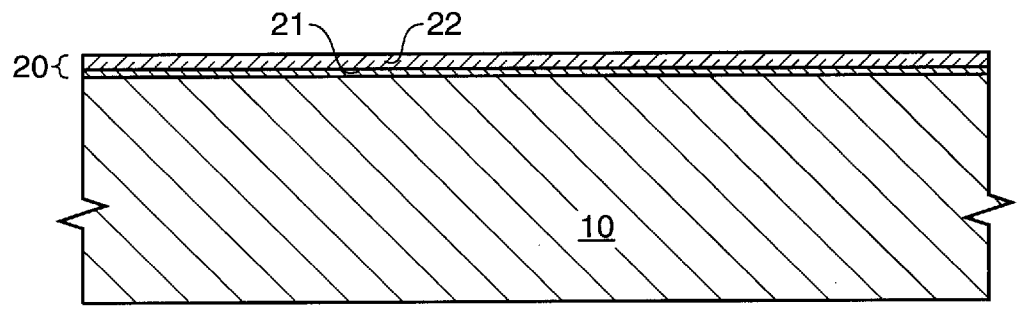
FIG. 2 is a cross-sectional view of the in-process DRAM array of FIG. 1 following conditioning of the dielectric film.

Referring now to FIG. 1, a semiconductor starting substrate 10 is fabricated to the point that a field effect gate dielectric layer 11 has been formed on substrate 10. Next, during a first annealing period, gate dielectric 11 is irradiated using ultraviolet (UV) light irradiation from lamp 12, while in a ambient exhibiting the properties of self-limiting oxidation. Following the first annealing period, gate dielectric layer 11 is exposed to an oxygen ambient during a second annealing period. Using UV light or VUV light during this annealing period is very effective as the higher energy photons also activate the underlying substrate surface leading to better interfaces between the substrate and the deposited films. The result of these annealing periods form a conditioned dielectric layer 20 which is made up of oxidation barrier portion 21 and densified dielectric portion 22.

On the molecular scale, the photochemical reaction starts with the adsorption of a photon by a molecule, in this case molecules of dielectric layer 20. The molecules are thereby promoted to an excited state and promote new chemical species which have their own distinct chemical and physical properties. As the photochemical event starts with the absorption of a photon by the dielectric molecule, the excited dielectric molecule may now react chemically with another species that is provided by the self-limiting oxidation ambient and thus form the oxidation barrier portion 21 on the underlying substrate 10. As the oxidation barrier portion 21 builds up, the underlying substrate 10 is no longer oxidizable and thus the ambient becomes a self-limiting oxidation ambient. This self-limiting oxidation process is the result of the formation of oxidation barrier layer 21 (such as nitride) which forms at the interface (between substrate 10 and dielectric 22) and blocks further oxygen diffusion.

Now that the oxidation of the underlying substrate 10 is basically stopped, the remaining dielectric layer 20 continues to be effected by the high energy photons of the UV light as the molecules of the dielectric layer remain in the excited state to allow densification of the dielectric layer 20 to form densified dielectric portion 22. During densification, the oxygen vacancies in dielectric layer 20 are filled by the mobile atomic oxygen which has been created by the UV light. The UV light also promotes energy which is sufficient to break some of the weaker, less stable bonds in the dielectric material. These broken bonds can then be passivated by the atomic oxygen present and these passivated bonds will then come to equilibrium in a more stable configuration. Overall, this UV anneal eliminates the vacancies and weak bonds in the material which would otherwise provide leakage current paths if still present.

A preferred ambient that exhibits the properties of self-limiting oxidation is an ambient such as NO and $N_2O$. Using this type of ambient would cause the formation of a nitride barrier layer on the underlying substrate and the nitride barrier layer then becomes part of the dielectric layer.

It is important that the ambient exhibit properties of self-limiting oxidation so that during the first annealing period a film is deposited on the dielectric material due to the presence of the self-limiting oxidation ambient. This deposited film will diffuse into the dielectric material and form an oxidation barrier film between the dielectric material being conditioned and the semiconductor structure. Because a second anneal is performed in an oxygen ambient (such as $O_2$, $O_3$, NO and $N_2O$) in order to fill any pinholes or such defects in the dielectric film, the presence of the oxygen ambient would normally promote further oxidation of the underlying semiconductor structure. With the oxidation barrier film in place prior to a second annealing period, the oxidation barrier film will limit and possibly stop any further oxidation of the semiconductor structure, due to the properties of self-limiting oxidation exhibited by the oxidation barrier film.

The first annealing period is performed at a temperature ranging from 200–1100° C. and preferably at a temperature ranging from 600–8000° C. The second annealing period is performed at a temperature ranging from 200–900° C. and preferably at a temperature ranging from 600–800° C. It is preferred that both the first and second annealing periods are performed in a rapid thermal processing chamber and are performed in-situ.

The wide temperature range is the result of the UV process. If low temperature is desired, due to thermal budget constraints, UV anneals provide a solution since the photon energy, in addition to thermal energy, work together to condition the film. This allows the anneal temperature to be lower than if thermal energy alone was used. The UV anneal can also be done at higher temperatures if that is required for a specific application. This might be the case if it is beneficial to have the material in a stable crystal phase following the anneal.

By performing the anneals in-situ, contamination is reduced since no wafer transfers are required. In-situ anneals also provide throughput advantages and avoid exposure of material to moisture subsequent to densification, which is important for hydroscopic materials (such as FTEOS). Since hydroscopic materials absorb water, it is important to avoid exposing them to water in order to maintain a stable material.

Figure 3:
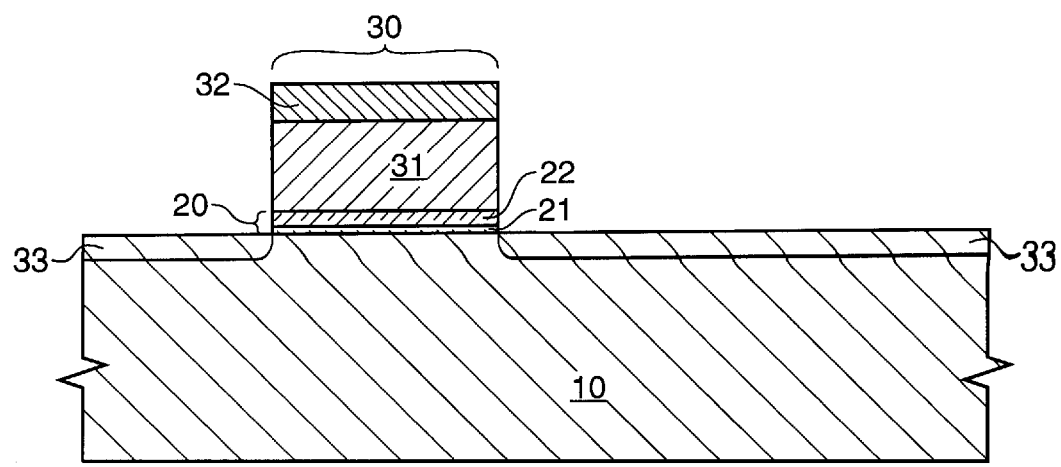
FIG. 3 is a cross-sectional view of the in-process DRAM array of FIG. 2 following formation of a field effect gate structure and field effect transistor source/drain regions.

Referring now to FIG. 3, a field effect transistor gate structure 30 is patterned and formed from polysilicon 31 and silicide 32, on gate dielectric layer 20. Source/drain regions 33 are implanted into substrate 10 to the sides of gate structure 30.

Figure 4:
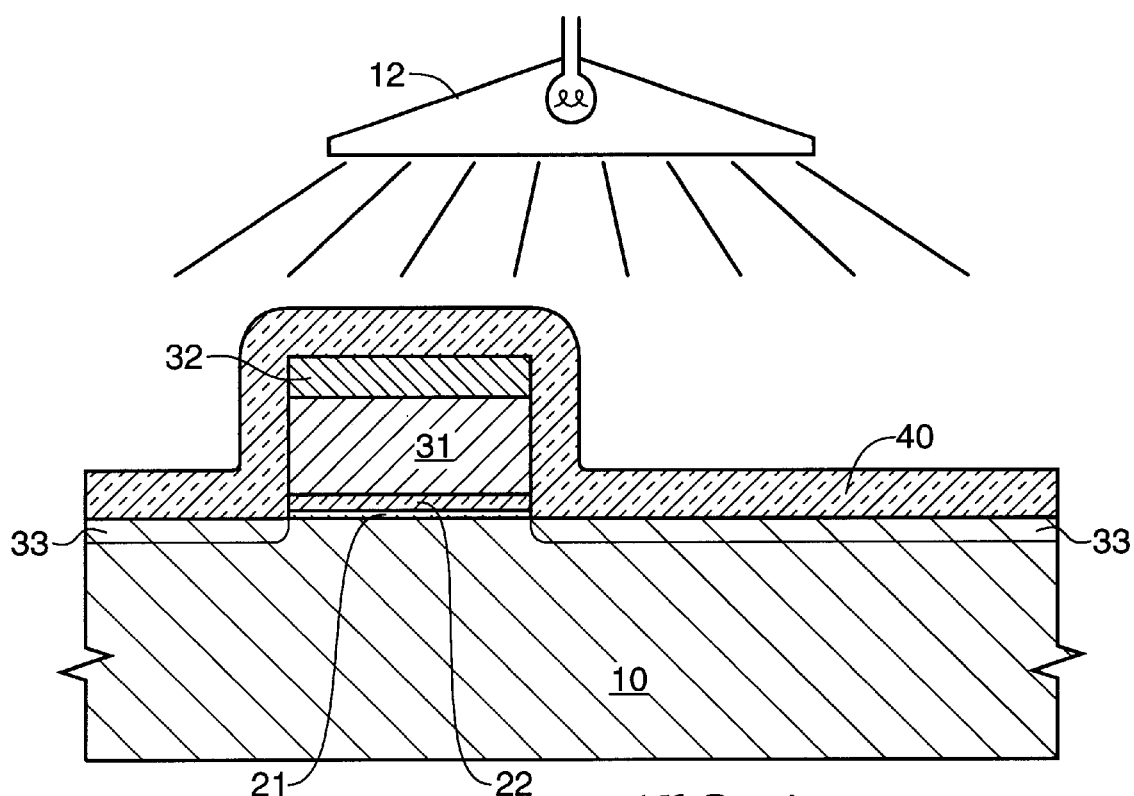
FIG. 4 is a cross-sectional view of the in-process DRAM array of FIG. 3 following the formation of a dielectric layer over the a field effect gate structure and field effect transistor source/drain regions followed by subjecting the wafer assembly to UV light.
Figure 5:
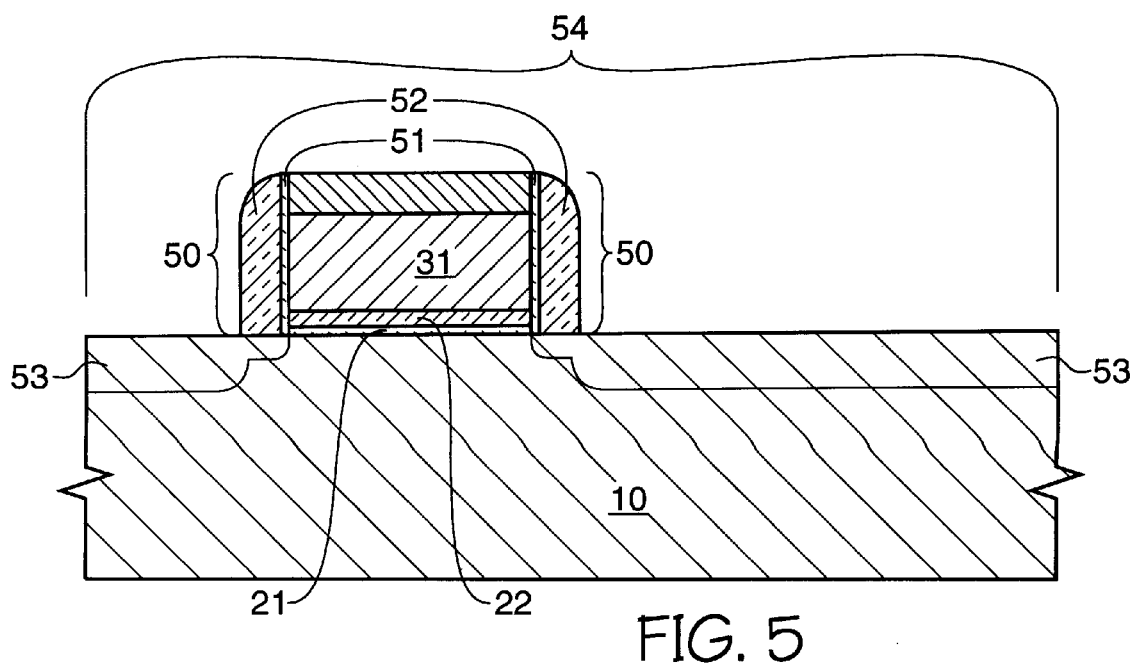
FIG. 5 is a cross-sectional view of the in-process DRAM array of FIG. 4 following the formation of conditioned field effect gate dielectric spacers and the completed formation of a field effect transistor.

Referring now to FIG. 4, dielectric layer 40 is deposited over gate structure 30 and source/drain regions 33. Dielectric layer 40 is then subjected to the first and second anneals, using the annealing conditions as set forth above, to form conditioned gate dielectric spacers 50 which is made up of oxidation barrier portion 51 and densified dielectric portion 52. As the oxidation barrier portion 51 builds up, the underlying gate structure 30 is no longer oxidizable and thus the ambient becomes a self-limiting oxidation ambient.

Now that the oxidation of the underlying substrate 30 is basically stopped, the remaining gate dielectric spacers 50 continue to be effected by the high energy photons of the UV light as the molecules of the dielectric layer remain in the excited state to allow densification of the gate dielectric spacers 50, thus forming densified dielectric portion 52.

Either before or after the conditioning step of spacers 50, an implant forms deeper diffusion regions into the original source/drain regions 33 which results in the final formation of source/drain regions 53. At this point the field effect transistor 54 is complete, being made up of gate structure 30, underlying gate dielectric 20, gate dielectric spacers 50, and source/drain regions 53.

Figure 6:
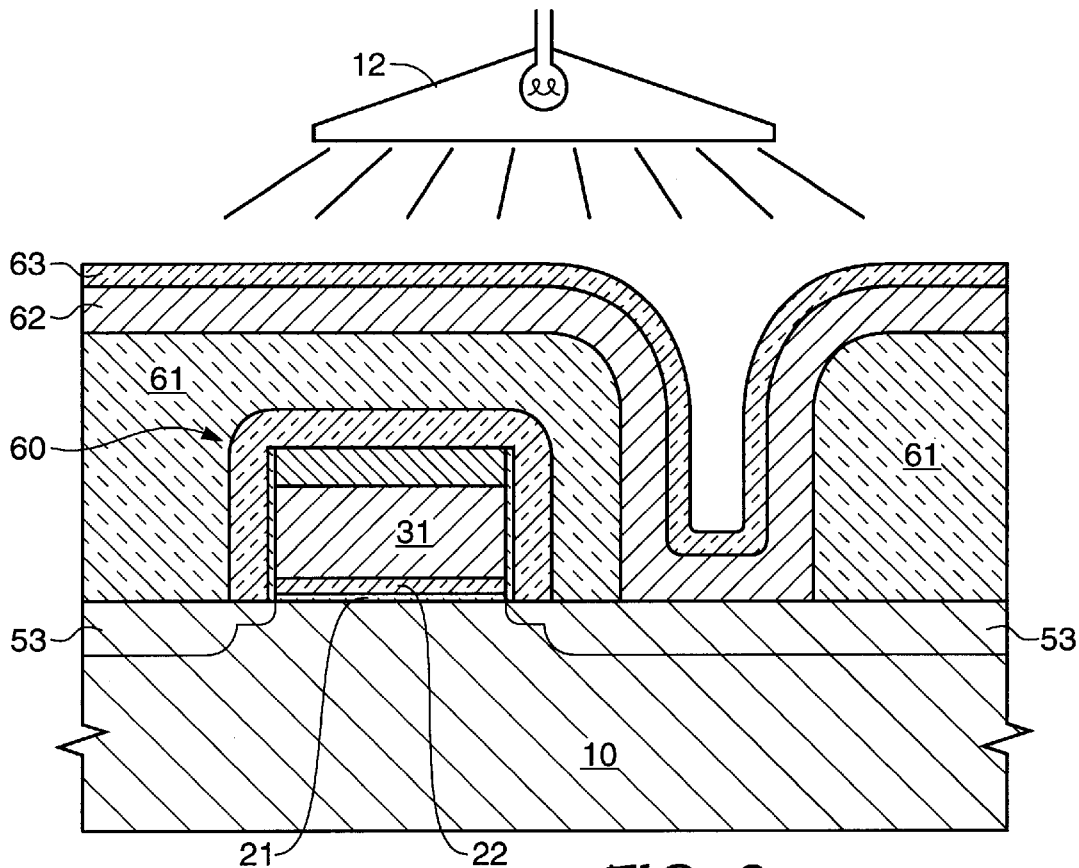
FIG. 6 is a cross-sectional view of the in-process DRAM array of FIG. 5 following the formation of capacitor dielectric layer on a conductive capacitor plate, after which the capacitor dielectric is subjected to UV light.

Referring now to FIG. 6, additional insulation layer 60 coats dielectric spacers 50 and the top of gate 30. A planarized layer of insulative material 61 covers transistor 54 and an opening is provided through insulative material 61 to provide access to a source/drain region 53 of transistor 54. A conductive layer 62, such as conductively doped polysilicon, covers insulative layer 61 and makes contact to source/drain region 53. Next, a dielectric layer 63 coats conductive layer 62. It is preferred that this dielectric layer be deposited using a reactive organo precursor such as one selected from a Yttrium source diluted with $O_2$, NO and $N_2O$. Using a Yttrium source provides the advantage of forming a Yttrium oxide layer (as layer 63) at the silicon dielectric interface which thus provides a high dielectric constant oxide material (Yttrium oxide has approximately 7 times the dielectric constant of silicon dioxide).

Figure 7:
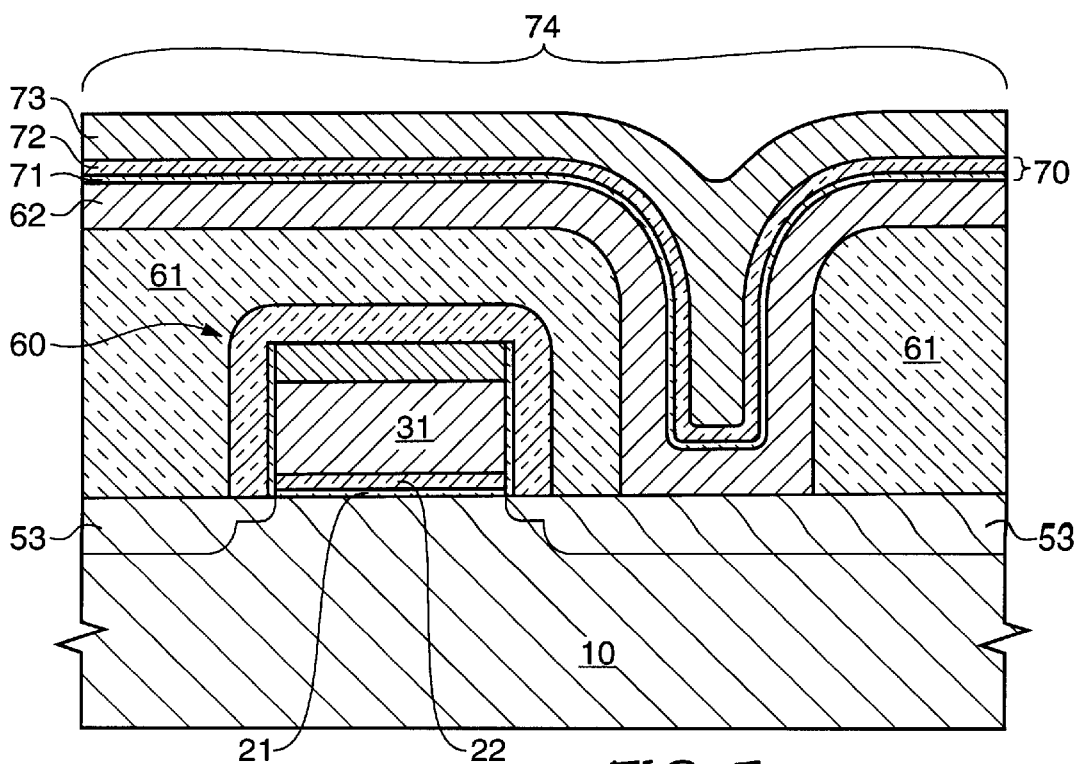
FIG. 7 is a cross-sectional view of the in-process DRAM array of FIG. 6 following the formation of a completed memory cell.

Referring now to FIG. 7, dielectric layer 63 is then subjected to the first and second anneals, using the conditions as set forth above, to form a conditioned capacitor dielectric layer 70 which is made up of oxidation barrier portion 71 and densified dielectric portion 72. As the oxidation barrier portion 71 builds up, the underlying capacitor structure 62 is no longer oxidizable and thus the ambient becomes a self-limiting oxidation ambient.

Now that the oxidation of the underlying capacitor structure 62 is basically stopped, the remaining capacitor dielectric layer 70 continues to be effected by the high energy photons of the UV light as the molecules of the dielectric layer remain in the excited state to allow densification of the capacitor dielectric layer 70, thus forming densified dielectric portion 72. Finally, conductive layer 73 is formed on conditioned capacitor dielectric layer 70 to make up the second capacitor plate of capacitor 74.

In the context of the present invention, the phrase: "an ambient exhibiting the properties of self-limiting oxidation" is intended to encompass a property of an ambient gas that not only oxidizes a material as the material is exposed to the ambient gas, but also forms at least a second film within the oxidation layer which becomes a barrier layer to oxygen atoms still present in the chamber. As the oxidation barrier layer is being formed, its thickness increases, which in turn increases the barrier layer's ability to block the diffusion of oxygen atoms. As the number of oxygen atoms diffusing through the barrier layer diminishes, further oxidation buildup of the underlying material is severely limited.

Figure 8:
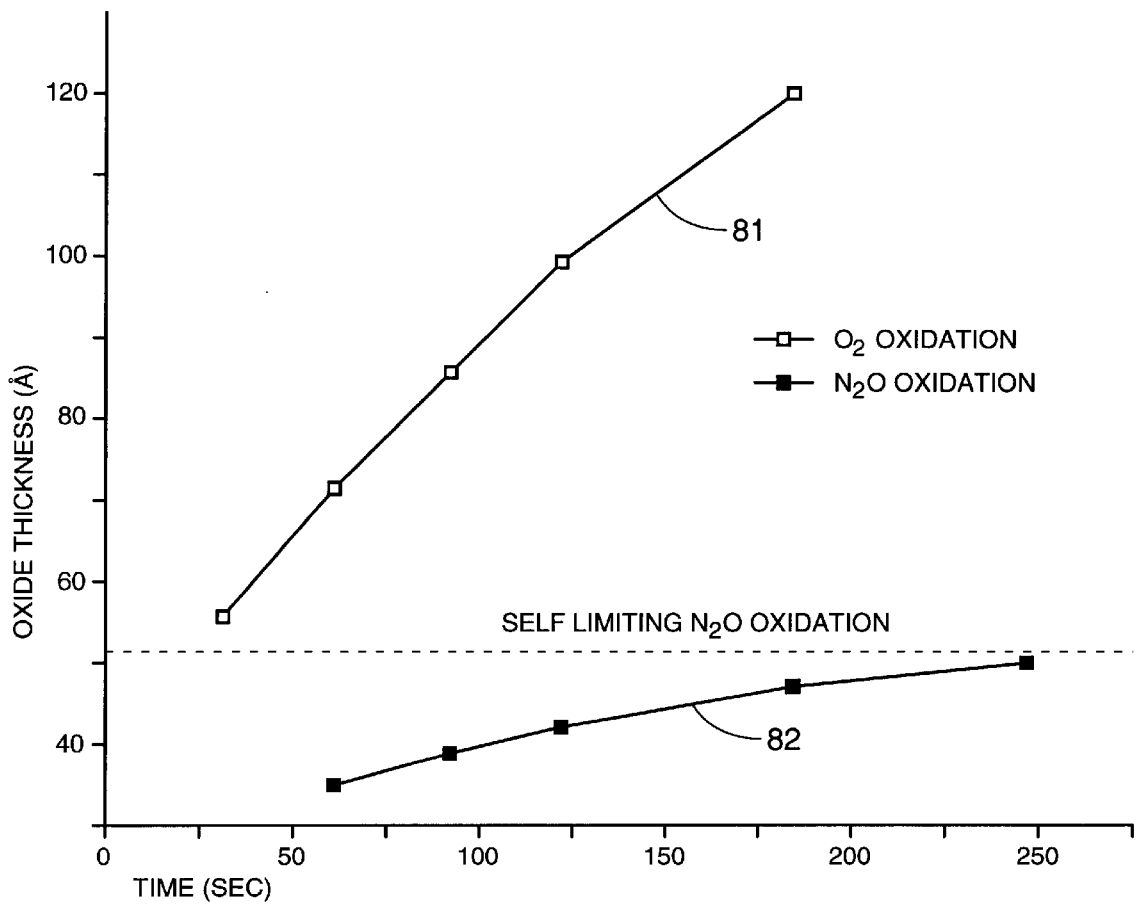
FIG. 8 is a graph showing the oxidation buildup resulting from exposing a material to a straight oxygen ambient as compared to the oxidation buildup resulting from exposing the same type of material to an oxygen and nitrogen ambient.

To further illustrate the concept of self-limiting oxidation, the graph of FIG. 8, is a graph showing the oxidation buildup resulting from exposing a material to a straight oxygen ambient as compared to the oxidation buildup resulting from exposing the same type of material to an oxygen and nitrogen ambient. In the first case the ambient is straight oxygen and the oxidation thickness is represented by graph line 81. Graph line 81 shows that the oxidation is increasing fairly rapidly as the oxide thickness increases from approximately 60 angstroms to 120 angstroms during an oxidation period from 50–175 seconds. In the second case the ambient is nitrogen and oxygen ($N_2O$) and the resulting oxidation thickness is represented by graph line 82. Graph line 82 shows that the increase in oxidation is very slow and is actually starting to level off as the oxide thickness increases from approximately 10 angstroms to 40 angstroms during an oxidation period from 50–175 seconds. In fact, due to the presence of nitrogen and thus the formation of a nitride layer (not shown), the oxidation buildup after approximately 50 seconds is less than a sixth in thickness than the oxidation buildup using straight oxygen for the same time period.

Although an exemplary implementation of the present invention describes the fabrication of a dynamic random access memory cell, one skilled in the art will appreciate that individual processing steps may be used separately to gain the advantages of a conditioned dielectric material as disclosed herein. Therefore, it will be evident to those having ordinary skill in the art of semiconductor fabrication that changes and modifications may be made thereto without departing from the scope and spirit of the invention as claimed.

What is claimed is:

1. A method for conditioning a dielectric material on a semiconductor substrate structure during a semiconductor fabrication process, comprising the steps of:

during a first annealing period, irradiating an exposed dielectric film with ultraviolet light in the presence of an ambient exhibiting the properties of self-limiting oxidation to densify said exposed dielectric film while an oxidation barrier layer is formed between said dielectric film and said semiconductor substrate structure that is sufficient to deter further oxidation of said semiconductor substrate structure;

immediately following said first annealing period and during a second annealing period, exposing said dielectric film to an oxygen ambient to oxidize the surface of said dielectric film.

2. The method of claim 1, wherein said dielectric material possesses a dielectric constant of a least seven.

3. The method of claim 1, wherein said ambient is an ambient selected from the group consisting of NO and $N_2O$.

4. The method of claim 1, wherein said oxygen ambient is an ambient selected from the group consisting of $O_2$, $O_3$, NO and $N_2O$.

5. The method of claim 1, wherein said first annealing period is performed at a temperature ranging from 200–1100° C.

6. The method of claim 1, wherein said first annealing period is performed at a temperature ranging from 600–800° C.

7. The method of claim 1, wherein said second annealing period is performed at a temperature ranging from 200–900° C.

8. The method of claim 1, wherein said second annealing period is performed at a temperature ranging from 600–800° C.

9. The method of claim 1, wherein said first annealing period is performed in a rapid thermal processing chamber.

10. The method of claim 1, wherein said second annealing period is performed in a rapid thermal processing chamber.

11. The method of claim 1, wherein said first and second annealing periods are performed in-situ.

12. The method of claim 1, wherein said reactive organo precursor is a precursor selected from a Yttrium source diluted with $O_2$, NO and $N_2O$.

13. A method for conditioning a capacitor dielectric on a capacitor structure during a semiconductor fabrication process, comprising the steps of:

during a first annealing period, irradiating an exposed capacitor dielectric film with ultraviolet light in the presence of an ambient exhibiting the properties of self-limiting oxidation to densify said exposed capacitor dielectric film while an oxidation barrier layer is formed between said capacitor dielectric film and said capacitor structure that is sufficient to deter oxidation of said capacitor structure;

immediately following said first annealing period and during a second annealing period, exposing said capacitor dielectric film to an oxygen ambient to oxidize the surface of said dielectric film.

14. A method for conditioning a field effect transistor gate dielectric on a field effect transistor gate structure during a semiconductor fabrication process, comprising the steps of:

during a first annealing period, irradiating an exposed field effect transistor gate dielectric film with ultraviolet light in the presence of an ambient exhibiting the properties of self-limiting oxidation to densify said exposed field effect transistor gate dielectric film while an oxidation barrier layer is formed between said field effect transistor gate dielectric film and said field effect transistor gate structure that is sufficient to deter oxidation of said field effect transistor gate structure;

immediately following said first annealing period and during a second annealing period, exposing said field effect transistor gate dielectric film to an oxygen ambient to oxidize the surface of said field effect transistor gate dielectric film.

15. A method for conditioning insulative spacers about the sidewalls of a field effect transistor gate structure during a semiconductor fabrication process, comprising the steps of:

during a first annealing period, irradiating exposed insulative spacers with ultraviolet light in the presence of an ambient exhibiting the properties of self-limiting oxidation to densify said exposed insulative spacers while an oxidation barrier layer is formed between said insulative spacers and said field effect transistor gate structure that is sufficient to deter oxidation of said field effect transistor gate structure;

immediately following said first annealing period and during a second annealing period, exposing said insulative spacers to an oxygen ambient to oxidize the surface of said insulative spacers.

* * * * *